(12) United States Patent
Aurongzeb

(10) Patent No.: US 10,481,637 B2
(45) Date of Patent: Nov. 19, 2019

(54) METAL CERAMIC CHASSIS FOR PORTABLE DEVICES

(71) Applicant: Dell Products L.P., Round Rock, TX (US)

(72) Inventor: Deeder M. Aurongzeb, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 546 days.

(21) Appl. No.: 15/195,020

(22) Filed: Jun. 28, 2016

(65) Prior Publication Data

US 2016/0306388 A1    Oct. 20, 2016

Related U.S. Application Data

(62) Division of application No. 13/671,286, filed on Nov. 7, 2012, now Pat. No. 9,400,524.

(51) Int. Cl.
    *H05K 5/04*      (2006.01)
    *G06F 1/16*      (2006.01)
    *H05K 5/00*      (2006.01)

(52) U.S. Cl.
CPC .......... *G06F 1/1633* (2013.01); *G06F 1/1616* (2013.01); *G06F 1/1656* (2013.01); *H05K 5/0004* (2013.01); *H05K 5/04* (2013.01); *Y10T 29/49826* (2015.01)

(58) Field of Classification Search
CPC .... G06F 1/1633; G06F 1/1656; G06F 3/0425; H05K 5/0004; H05K 5/04; Y10T 29/49826

USPC .......................................................... 148/276
See application file for complete search history.

(56) References Cited

U.S. PATENT DOCUMENTS

| | | | |
|---|---|---|---|
| 2,776,896 A | | 1/1957 | Harman et al. |
| 3,352,731 A | * | 11/1967 | Schwertz ................. G03G 7/00 101/471 |
| 4,491,622 A | | 1/1985 | Butt |
| 6,949,289 B1 | | 9/2005 | Lawton et al. |
| 7,170,181 B2 | | 1/2007 | Coolbaugh et al. |
| 7,724,532 B2 | * | 5/2010 | Zadesky ............. H04M 1/0202 361/752 |
| 8,215,223 B2 | | 7/2012 | Lucuta et al. |
| 9,024,446 B2 | | 5/2015 | Usui et al. |
| 2005/0003396 A1 | | 1/2005 | Ozkan et al. |
| 2006/0249245 A1 | | 11/2006 | Balling et al. |
| 2009/0295045 A1 | | 12/2009 | Akash et al. |
| 2012/0187112 A1 | | 7/2012 | Demol et al. |
| 2012/0206870 A1 | | 8/2012 | Weber et al. |

* cited by examiner

*Primary Examiner* — Jie Yang
(74) *Attorney, Agent, or Firm* — Zagorin Cave LLP; Robert W. Holland

(57) ABSTRACT

An information handling system chassis is built at least in part from ceramic elements. For example, a transparent aluminum oxide ceramic portion covers a touchscreen to provide a rigid outer surface for accepting end user inputs. As another example, a ceramic chassis element has a ceramic material formed around a metal material of similar substance with bonding of the ceramic to the underlying material enhanced with oxidation of the outer surface of the metal material.

3 Claims, 6 Drawing Sheets

METAL CERAMIC CHASSIS FOR PORTABLE DEVICES

CROSS REFERENCE TO RELATED APPLICATIONS

U.S. patent application Ser. No. 13/671,263, entitled "Information Handling System Ceramic Chassis," inventors Nicholas D. Abbatiello and Deeder M. Aurongzeb, filed Nov. 7, 2012, describes exemplary methods and systems and is incorporated by reference in its entirety.

CONTINUING DATA

This application is a division of U.S. patent application Ser. No. 13/671,286, filed Nov. 7, 2012, entitled "Metal Ceramic Chassis for Portable Devices," which includes exemplary systems and methods and is incorporated by reference in its entirety.

BACKGROUND OF THE INVENTION

Field of the Invention

The present invention relates in general to the field of information handling system chassis, and more particularly to a metal ceramic chassis for portable devices.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems have tended over time to increase their processing and storage capabilities even while decreasing their footprint. For example, ultra-lightweight laptop and tablet information handling systems support many advanced functions in extremely portable chassis. One difficulty with such lightweight chassis is that structural elements of the chassis tend to have less strength and robustness due to the less-substantial size and thickness of material used to build the structural elements so that weight is decreased. For example, tablet information handling systems typically have touchscreen displays that accept inputs made as gestures at the touchscreen. Lightweight chassis for supporting touchscreens tend to have reduced rigidity so that touches cause oscillation at chassis structural elements. Plastic components offer light weight, but tend to lack the strength to stand up to normal use. Metal and carbon fiber components can interfere with wireless communications, often do not offer favorable aesthetics and tend to impact recyclability of a system. Yet, chassis structural elements that have too great of rigidity are at risk of rupture in the event of too great a deflection.

SUMMARY OF THE INVENTION

Therefore a need has arisen for a system and method which supports information handling system components in chassis with ceramic elements.

In accordance with the present invention, a system and method are provided which substantially reduce the disadvantages and problems associated with previous methods and systems for supporting information handling system components in a chassis. Ceramic materials are used to build chassis elements that are assembled into an information handling system chassis. Various chassis elements used to assemble a chassis have various ceramic materials for providing desired color, transparency, ductility and hardness. For example, oxide and nitride ceramics heated in varying manners provide different ductility to support functions of different portions of an information handling system, such supporting inputs through a ceramic touchscreen or supporting processing components in a ceramic base. A chassis element may be formed with layers of different ceramic and metal materials to provide tailored structural and aesthetic characteristics. The metal base specifically important when the thickness of the base is <1 mm. To reduce stress and deflection in ceramic chassis low density metal plate is critical to support ceramic structure.

More specifically, an information handling system processes information with a processor and memory disposed in a chassis assembled from ceramic chassis elements. In various embodiments, the chassis elements are built of various ceramic materials formed with various manufacture techniques to provide targeted material characteristics in support of information handling system functions. For instance, a display cover has a relatively rigid and transparent ceramic material to allow interaction by an end user with a touchscreen display through the ceramic material without introducing excessive oscillations. A ceramic bezel having a relatively high degree of ductility couples to a ceramic chassis base having a relatively low degree of ductility. In some alternative embodiments, multi-layer ceramic chassis elements have layers of ceramic materials and/or metal materials in which different layers have different levels of ductility. Ceramic chassis elements are formed from a ceramic mixture, such as a ceramic base of alumina, having a stiffener that makes the mixture suitable as an injection molding feedstock. Coupling devices are integrated in the ceramic material before sintering so that sintering causes densification of the ceramic material and coupling device into an integrated chassis element. Aesthetic appearance is provided by adding a dopant to the ceramic mixture or treating the ceramic after sintering. In order to provide a uniform appearance, metal chassis elements are coated with a ceramic and annealed to diffuse the ceramic material with the underlying metal material.

The present invention provides a number of important technical advantages. One example of an important technical advantage is that an information handling system chassis is assembled from ceramic and other materials to provide tailored functionality with ceramic characteristics. For example, a tablet information handling system has a ceramic chassis element base that integrates ceramic coupling devices to secure processing components in a strong, durable and relatively rigid base. The tablet has a more ductile ceramic bezel holding the display to the base to provide greater flexibility in the event of end user impacts to the base. A transparent ceramic cover over the display adapts to accept end user inputs made to a touchscreen of the display. Ceramic materials and coatings provide light weight chassis elements to build a portable information handling system that has a tough exterior with a durable finish integrated with the ceramic material, such as with a dopant, micro arcing, or deposition of an overlying material.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Ceramic chassis elements support information handling system components with desired rigidity and aesthetics. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
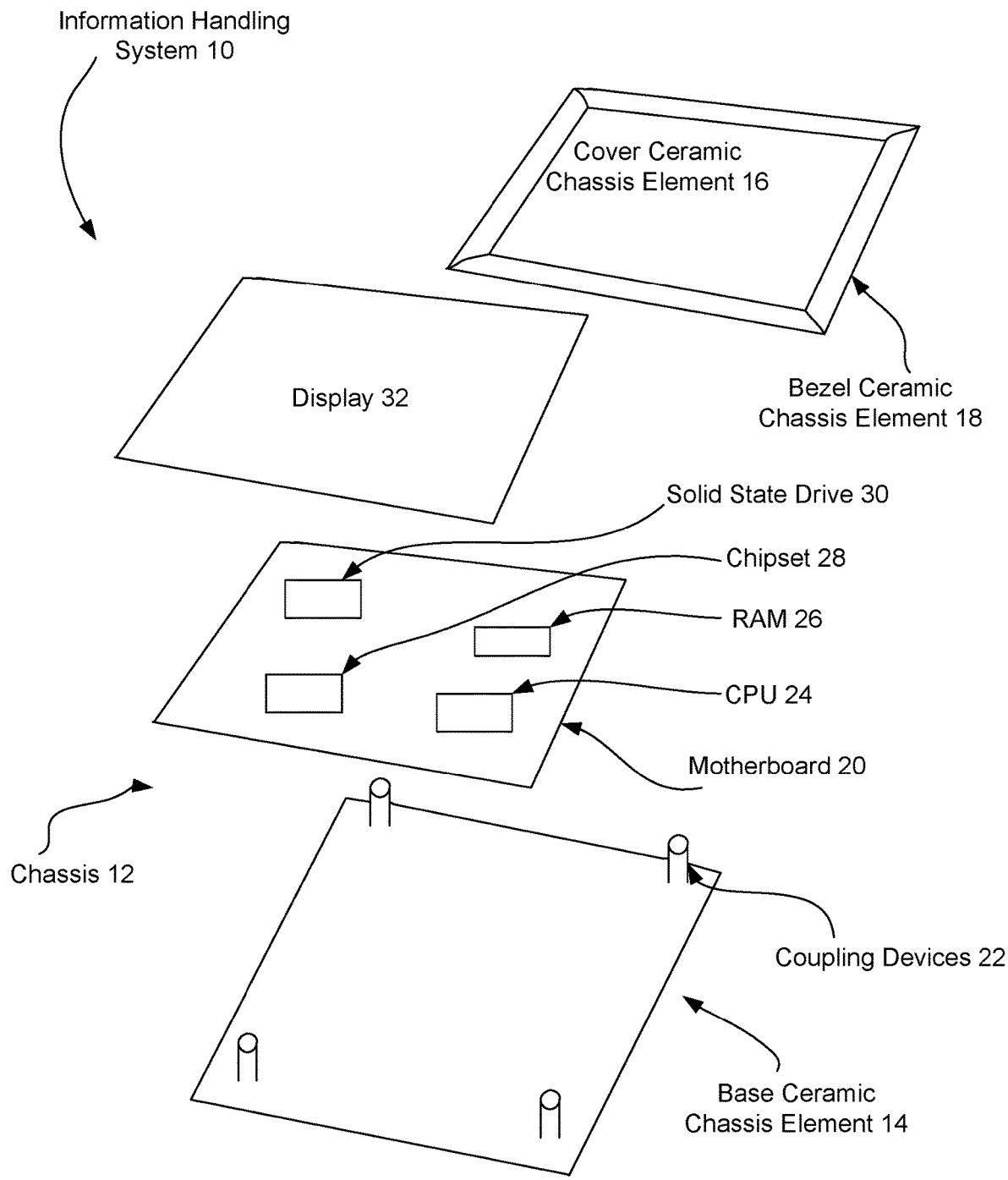
FIG. 1 depicts a blow-up view of a tablet information handling system disposed in a chassis having ceramic elements.

Referring now to FIG. 1, a blow-up view depicts a tablet information handling system 10 disposed in a chassis 12 having ceramic elements, such as a base 14, a cover 16 and a bezel 18. A motherboard 20 couples to ceramic coupling devices 22 integrated with ceramic base 14 and supports communication between various processing components that cooperate to process information, such as a CPU 24 that executes instructions, RAM 26 that stores instructions, a chipset 28 that coordinates interactions between processing components and solid state drive 30 that provides persistent storage of instructions. Chipset 28 includes graphics processing capabilities that process information to generate information for presentation at display 32. Display 32 has a touchscreen that accepts end user touches and inputs and provides the inputs to chipset 28 for use by CPU 24. Bezel 18 is a ceramic element that couples display 32 in place over base 14 in a tablet configuration. Cover 16 is a transparent ceramic element that protects display 32. Ceramic elements 14, 16 and 18 assemble to provide a chassis with multifunctional ceramic materials that can embed sensors for an improved user experience. Chassis 12 in general and some ceramic elements in particular have two or more layers with the layers having different ductile characteristics. For example, a structure of two or more layers may include an insert molded or bonded metal plate placed diagonally or in other orientations, which is thinner than ceramic layers. Although the ceramic elements depicted by the example embodiment of FIG. 1 assemble to form a tablet configuration, other configurations of information handling systems may be used, such as mobile telephone, clamshell and desktop configurations.

Figure 2:
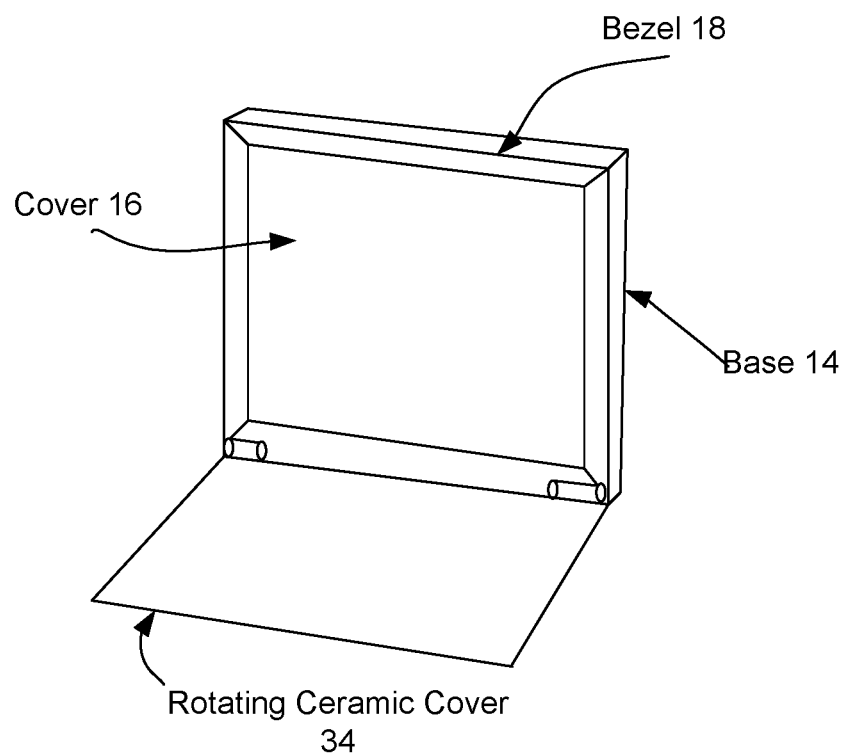
FIG. 2 depicts a side perspective view of a tablet information handling system having a chassis with ceramic elements and an open cover.

Referring now to FIG. 2, a side perspective view depicts a tablet information handling system 10 having a chassis 12 with ceramic elements and an open rotating cover 34. Ceramic elements used to assemble chassis 12 provide various ductile characteristics to support information processing functions and end user interactions. For example, base 14 has a high stiffness to provide adequate support for processing components disposed within base 14, such as by limiting movement relative at a motherboard so that electrical connections do not suffer stress or break. Bezel 18 has a lower stiffness than base 14 to absorb some energy from end user interactions. Cover 16 is a functional sensor ceramic that provides high rigidity to reduce oscillations introduced by end user inputs to the touchscreen. In one embodiment, cover 16 includes persistent ceramic inclusions that provide light emissions after the display is powered down, such as a red glow. Rotating cover 34 provides a transparent glass ceramic material to protect cover 16 when an end user does not need access to the touchscreen.

Figure 3:
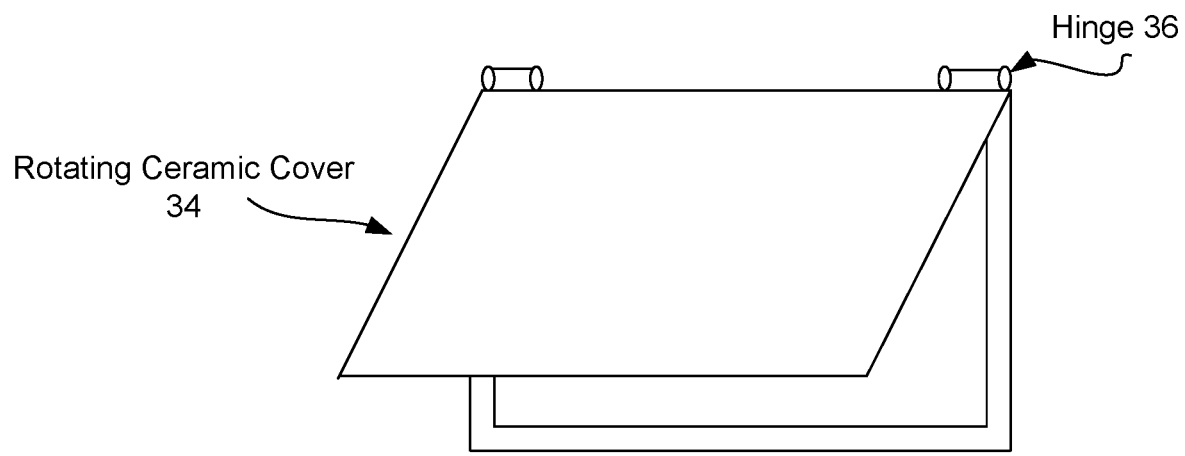
FIG. 3 depicts a side perspective view of a tablet information handling system having a chassis with ceramic elements and a closing cover.

Referring now to FIG. 3, a side perspective view depicts a tablet information handling system having a chassis with ceramic elements and a closing rotating ceramic cover 34. Rotating ceramic cover 34 has integrated ceramic hinges 36 that couple to chassis 12. Combining ceramic elements having different ductile characteristics allows tailoring of chassis 12 to address component breakage, heat conductivity and EMC characteristics, such as by layering individual ceramic elements with metal inserts. Ceramic manufacturing by injection molding, deposition or other techniques to have a metal based ceramic with the same element as a metal insert provides a stable material for long lasting chassis life. The ceramic elements are built from oxide or nitride materials, such as Al2O3, MgO, HfO, LuO and Si oxide or Oxynide in the access of >70% and a 10% of Y,V oxide. Additional dopant in the access of 5% Ni, Ti, Co, Cr, and/or Zn is used to get desired color and optical properties. To support forming a desired chassis element shape with a press and mold technique, a polymer and nano clay are added in access of >5%, thus allowing the material to hold its shape after a press and mold. Nano clays are commercially available nanoparticles of layered mineral silicates that are classified based upon chemical composition and nanoparticle morphology, such as classes of montmorillonite, betonies, kaolinite, hectorite and halloysite. Organically-modified nano clays, known as organoclays, are an alternative to pure nano clays, which provide an attractive class of hybrid organic-inorganic nanomaterials with potential use in polymer nano composites, such as rheological modifiers, gas absorbents and drug delivery carriers. In the use of a ceramic chassis element, nano clay provides a stiffener and Rheological modifier to maintain a desired shape. The mixture of the ceramic material, dopant, polymer and nano clay forms a viscous material adapted to injection molding for forming a ceramic element chassis shape, such as a chassis portion having a thickness of approximately 1 mm. After forming the ceramic element chassis shape, sintering in a hydrogen or argon flow for 5 hours or greater at a temperature or 1000 degrees Celsius or greater densities the viscous material into a ceramic having desired rigidity.

Figure 4:
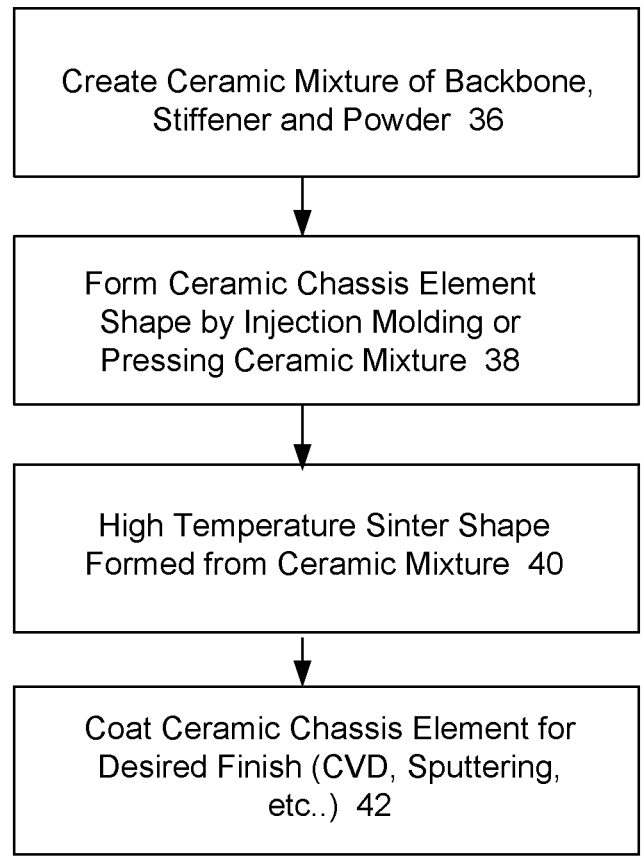
FIG. 4 depicts a flow diagram for a process of forming a ceramic chassis element.

Referring now to FIG. 4, a flow diagram depicts a process of forming a ceramic chassis element. The process starts at step 36 with a mixture of materials to form an injection molding material. For example, a three component powder is mixed having a ceramic main material, a stiffener and a powder as described with the various material options above. At step 38, the ceramic mixture is formed into a chassis element shape, such as with injection molding or by otherwise pressing the ceramic mixture into a tool. At step 40, the chassis element shape is subjected to high temperature sintering in a desired gas environment, such as an inert gas for greater than 6 hours, in order to densify the ceramic material to obtain desired rigidity. In one embodiment, alumina is used as the ceramic material and treated to have a transparent quality adapted to cover a display. As an alternative, at step 42 the sintered ceramic chassis element is coated to provide a desired color, such as with chemical vapor deposition (CVD) or sputtering at a high substrate temperature. In one embodiment, to obtain a target coating of a blue color, electrolytic plasma oxidation is performed on the sintered ceramic chassis element. Cobalt is deposited with E-beam evaporation in a low pressure environment to obtain a thickness or 0.5 micrometers and subsequently annealed at 700 degrees Celsius or greater in an oxygen atmosphere. In this example embodiment, the cobalt thickness should not exceed 1 micrometer in order to induce oxidation and diffusion. Other mixed-alloy or dip-coating followed by high temperature thermal annealing will also form stable coloration on an oxide ceramic.

Figure 5:
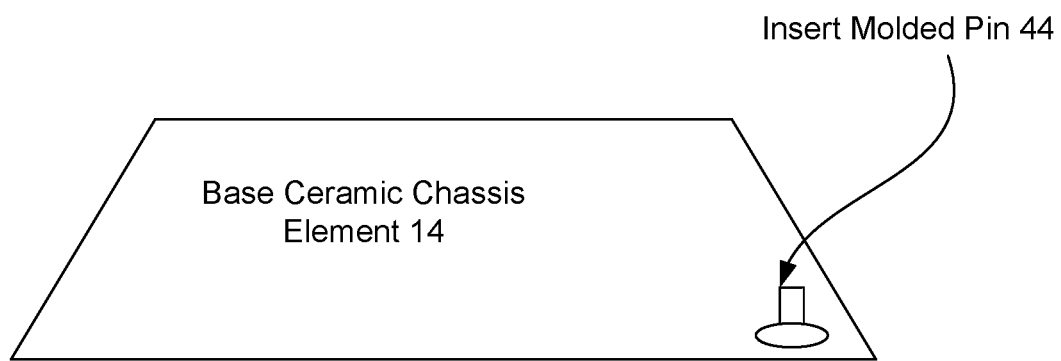
FIG. 5 depicts a ceramic chassis element having coupling devices to couple with information handling system components.

Referring now to FIG. 5, a ceramic chassis element 14 is depicted having coupling devices 44 to couple with information handling system components. For example, ceramic chassis element 14 is a plate of ceramic material forming a base of an information handling system. A ceramic plate of approximately 6 to 8 inches in length has insert molded coupling device pins 44 with a diameter of approximately 1 mm to hold a frame or other structure, such as a printed circuit board. In one example embodiment, the primary ceramic material is alumina with a dopant for coloring and the coupling devices 44 are formed from a material with a similar coefficient of thermal expansion (CTE), such as niobium having other metal alloys, such as Al, Ir, Ti, or Ni, or an oxide, such as aluminum titante. Other alternative materials for coupling devices 44 include a high carbon material, aluminum, pure niobium and tungsten. Sintering of a ceramic material that forms chassis element 14 after insertion of pin 44 results in a formed ceramic element having coupling devices 44 integrated with chassis element 14.

Figure 6:
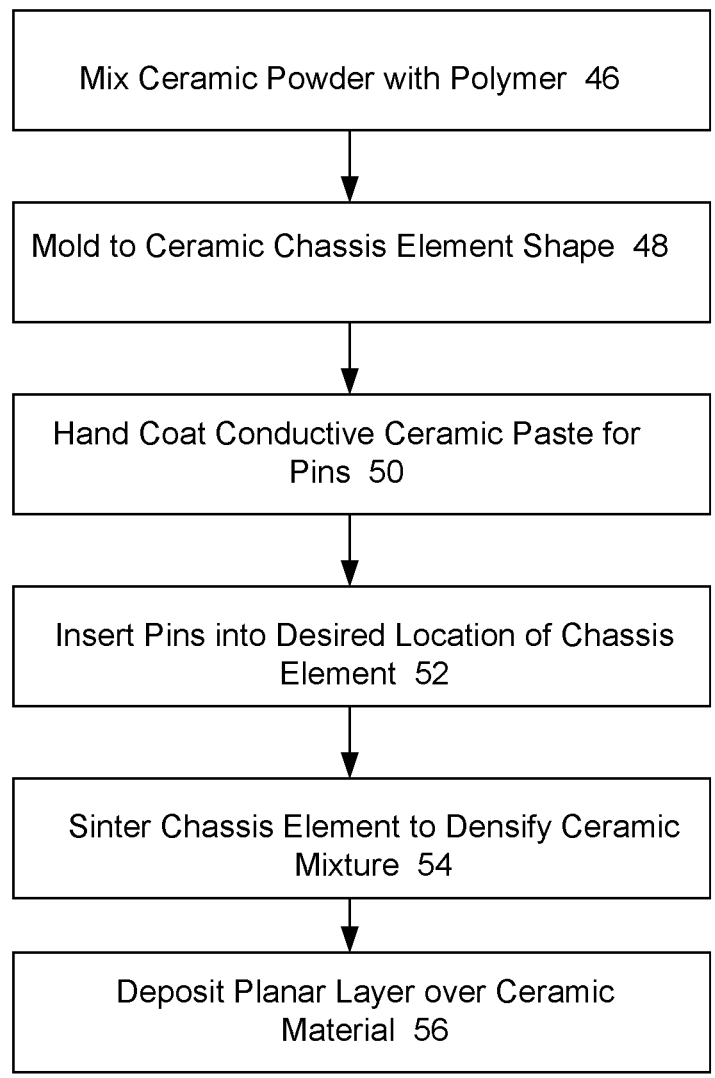
FIG. 6 depicts a flow diagram of a process for integrating a coupling device with a ceramic chassis element.

Referring now to FIG. 6, a flow diagram depicts a process for integrating a coupling device with a ceramic chassis element. The process starts at step 46 by mixing a ceramic powder with a polymer into a material that will hold a desired chassis element shape, such as with injection molding or pressing. In one example embodiment, the polymer organic vehicle includes three constituents: polypropylene grade SA868M available from Taiwan Polypropylene Co; paraffin wax available from Merck and stearic acid available from Merck. The ceramic material has particle distribution of a-alumina of 4 micrometers, available from Sumitomo of Japan. The mixture formulation has 70% by weight of 4 micrometer alumina, 10% nano alumina, such as alfa-aeser 100 nm; 5% GrO (graphene oxide); 3% of a pigment ceramic, such as MgO, Cr or Cu; 8% polyethylene glycol, 4% polypropylene, and 1% stearic acid. Mixing of the ceramic powder and binder is performed in a Z-type twin-screw blender at 180 degrees Celsius for 40 minutes. After mixing, the ceramic material is extruded into granules of 2 to 3mm to serve as a feedstock for injection molding. In alternative embodiments, alternative variations of the ceramic mixture may be developed as desired to obtain desired qualities of the ceramic chassis element.

At step 48, the ceramic mixture is formed to a chassis element shape with injection molding or another appropriate method. In the example embodiment, injection molding is performed with an Arburg 270-210-500 machine having a barrel temperature of 150 degrees Celsius to feed the nozzle and a mold temperature of 120 degrees Celsius. Initial injection pressure is set at greater than 1400 bar with a locking force of 300 kN. After the ceramic chassis element is formed with the ceramic mixture, the injection molded part is sintered at various temperatures to densify the ceramic material for desired ductility; however, before sintering coupling devices 44 are insert molded into the ceramic material. At step 50, in some embodiments, the location for insert molding and/or the coupling device is coated with a conductive ceramic paste to foster a strong ceramic bond between coupling device 44 and chassis element 14. At step 52, coupling device 44 is inserted into the ceramic material so that the material of the coupling device becomes part of the ceramic structure during the sintering and densification process. At step 54, the ceramic material with the inserted coupling device is sintered at a high temperature, such as at 1700 degrees Celsius or greater in a vacuum or environment of 700 torr argon for four hours or greater. Variations in the temperature and time of sintering provides variations in the characteristics of the ceramic material. For example, sintering at 1700 degrees Celsius for 12 hours provides a grain size of 150 micrometers +/−20% and a deflection at rupture of 1 mm; sintering at 1600 degrees Celsius for 2 hours provides a grain size of 20 micrometers +/−40% and a deflection at rupture of 0.3 mm.

At step 56, a planar layer is deposited over the ceramic chassis element for aesthetic or material objectives. For example, AlSiC or AlN deposited over the ceramic chassis element increases surface conductivity, such as with sputtering. Other types of materials may be selected based upon CTE or other properties desired for the chassis. For example, to enhance scratch resistance a titanium based surface is formed as a final exposed surface layer, such as titanium deposited to form a TiN or TiCN ceramic for an aluminum to titanium based ceramic. It should be noted that similarly for coating to be stable the base plate should have at least 1 composition common. For example, for TiN or TiCN to be stable during usage condition, base metal can be alloy but should have Ti in it, for example AlTi alloy. It should be noted that ductility of the ceramic plate can be increased by con-sintering the mix at >1500C with dispersed alumina fiber. $\alpha$-Al2O$_3$ fibers with diameters of 300-400 nm were successfully prepared through a convenient electrospinning combined with sol-gel technology process. The fibers can also be purchased commercially.

Figure 7:
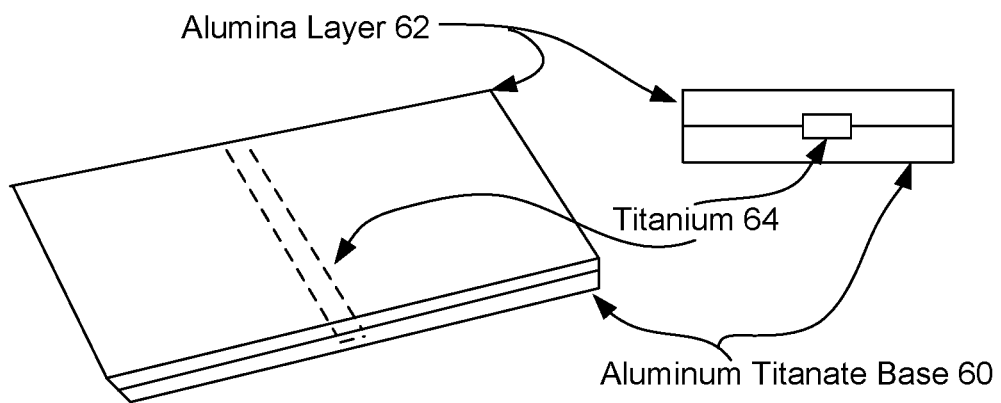
FIG. 7 depicts one embodiment of a multi-layered ceramic chassis element with one or more layers having different levels of ductility.

Referring now to FIG. 7, one embodiment is depicted of a multi-layered ceramic chassis element 58 with one or more layers having different levels of ductility. Two-layer ceramic chassis element 58 has an aluminum titanate base layer 60 and an alumina upper layer with an intermediate titanium plate 64. In one embodiment, chassis element 58 is formed with hot pressed diffusion bonding at approximately 1500 degrees Celsius. In an alternative embodiment, hot pressed diffusion bonding with a titanium alloy, such as Al, Ir, Ni, Ti, Nb, Mg, V, Ta, or Mo based alloys, having a similar diffusion point of Mania plate 64 is performed at a lower temperature, such as 1400 degrees Celsius. Note that melting point can be slightly modulated based on grain size and density. This is also true for AlIr, TiIr, NiTi, NbAlTi, and NbAl type alloy. Note that the metal plate can be further coated or doped with other conductive material like Cu or silver. In an alternative embodiment, multi-stage injection molding forms the piece. The aluminum titanate base plate 60 may have reinforcement with fiber, such as a graphene oxide fiber, glass fiber, carbide based ceramic fiber or carbon fiber, in order to increase the ductility of the base layer. In alternative embodiments, titanium plate 64 may be place in varying orientations, such as lengthwise or diagonally, in order to vary the ductility of the overall structure to various anticipated loads. In another embodiment, titanium plate 64 has a thickness that is less than the thickness of each of the overlying and underlying ceramic plates. In alternative embodiments, titanium plate 64 may have different types of single metals or alloys chosen to have a stiffness modulus of greater than 20 GPa.

Figure 8:
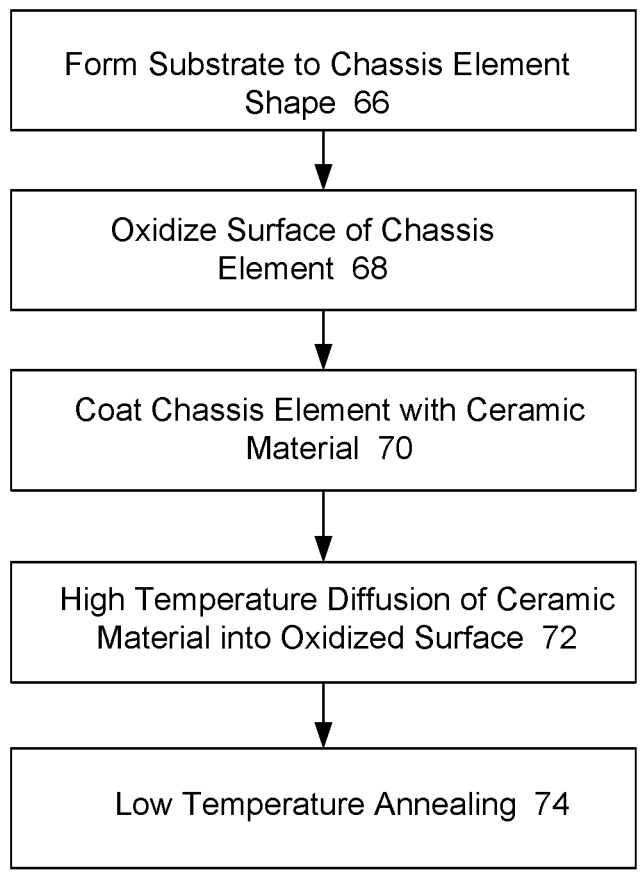
FIG. 8 depicts a flow diagram of a process for forming a ceramic chassis element with deposition of ceramic material over a metal base.

Referring now to FIG. 8, a flow diagram depicts a process for forming a ceramic chassis element with deposition of ceramic material over a metal base. A stable oxide ceramic is deposited over a metal chassis portion to provide a look and feel of a ceramic product. For example, the metal chassis portion is formed to a chassis element shape with a low melting point metal, such as a metal having a melting point of less than 2000 degrees Celsius. In one embodiment, the ceramic formed over the metal chassis has a metal composition similar to the metal chassis, such as an alumina ceramic formed over an aluminum chassis or titanium oxide formed over titanium. Coating of aluminum chassis elements with $Al_2O_3$ improves mechanical properties and provides a consistent appearance when chassis elements are assembled into a chassis that includes both metal and ceramic portions. Color and optical properties of alumina coated aluminum may be further adapted to a desired finish by combining suitable materials, such as Y2O3, $ZrO_2$, SiC and $TiO_2$, with an $Al_2O_3$—$ZrO_2$ ceramic outer coating providing a desired in finish in one embodiment. Note that after annealing the mixed composition can form like Al2TiO5—MgTi2O5 solid solution ceramics, i.e. Mg0.5AlTi1.5O5. In the system where TiO2 is not used, Yttrium, neodymium and zirconium based mixed ceramic can form. Based on deposition process and masking grain size can vary from fibrous and directional to random.

The process begins at step 66 with selection and forming of a substrate material into a chassis element shape. In the example embodiment, commercial aluminum plate is formed into a desired shape, such as an ALOCA 2024 aluminum sheet having a square shape with six inch sides and a thickness of approximately 0.6 mm. At step 68, the surface of the aluminum is prepared for deposition by encouraging oxidation to a desired depth, such as approximately 2 micrometers. In one embodiment, the aluminum plate is heated to 400 degrees Celsius using a radiative heating element under an oxygen flow. After oxidation of the outer surface, the process continues to step 70 to coat the oxidized surface with ceramic material, such as alumina. For example, alumina is sputter deposited to a thickness of 50 micrometers. Oxidation and sputtering may be performed on the entire surface or just a portion of the surface that is exposed after the chassis is assembled. At step 72, the sputtered chassis element is exposed to a high temperature to diffuse the alumina into the oxidized surface of the sheet metal, such as a temperature of 1700 degrees Celsius. At step 74, after diffusion of the alumina into the oxidized surface, the chassis element is subjected to a low temperature annealing, such as 400 degrees Celsius, to provide a desired diffusive finish. A relatively thin ceramic finish with good diffusion prevents cracking of the ceramic surface. In an alternative embodiment, a magnesium chassis is coated with MgO or MgO+SiO ceramic using the coating process. In another alternative embodiment, a chassis alloy of Al—Mg—Si is coated with a ceramic coating of MgO—$Al_2O_3$—$SiO_2$ or $MgAl_2O_4$. Similarly Al—Ti—Si—Y type alloy can be oxidized followed by formation or coating of Al2O3—TiO2—SiO2—Y2O3. Note that Ti—Si—Y is <20% of the overall content of the metal alloy.

Figure 9:
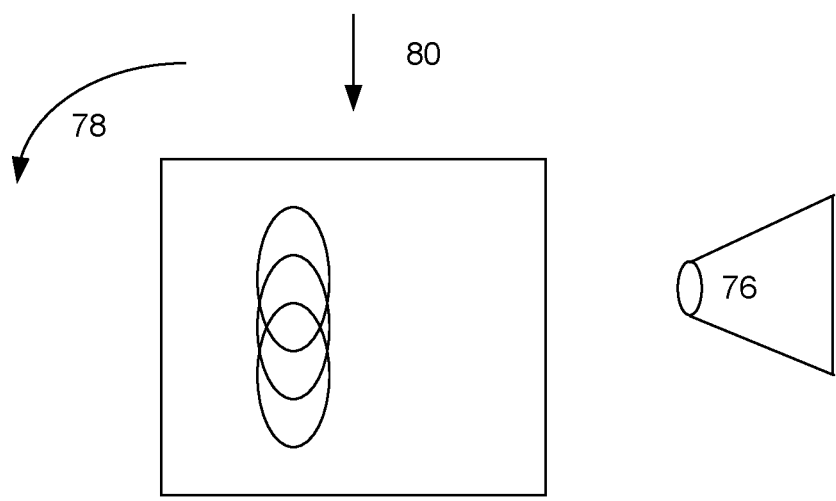
FIG. 9 depicts an example of motion imparted at a chassis element during micro arc deposition to provide a desired surface pattern.

In various embodiments, various surface colors or degrees of transparency may be achieved with ceramic materials and/or coatings. In one embodiment, a black ceramic surface is formed over aluminum or an aluminum alloy with a 0.1 mol/L NaAlO2 electrolyte system and commercial micro arc oxidation. The aluminum is first coated with a 100 nm of copper, such as using chemical vapor deposition, and then annealed in an inert environment for an hour at a temperature of near the melting point of the aluminum, such as 650 degrees Celsius, to promote adhesion of the copper to the aluminum. Then micro arc oxidation is applied to oxidize the surface, such as with oxidation having a depth of approximately 10 micrometers or greater to ensure adequate spectral emissivity. The amount of copper used for the coating should remain less than 5% by weight of the chassis element. In one embodiment, the coating may be applied over a sputtered aluminum-based ceramic coating or other types of ceramics. In an alternative embodiment, the coating adds color to an aluminum or other base metal, which is coated by an alumina or other ceramic having a transparent or translucent quality to allow the color of the coating to show. FIG. 9 depicts one example of a motion imparted to the chassis element 14 during micro arc oxidation with a micro arc 76. Rotational motion 78 in combination with longitudinal motion 80 provides an elongated circular pattern at the surface of chassis element 14.

Coating a chassis of aluminum or magnesium metal and/or alloy with a like-metal ceramic provides increased wear resistance and hardness to what otherwise tend to relatively soft materials. Desired pigmentations may be introduced for durable finishes with a hard outer surface. For example, vanadium doped zircon pigments are added with a ceramic mixture of monoclinic zirconia and silica using sodium fluoride as a mineralizer. V+4-$ZrSiO_4$ pigments can rise to a blue coloration at a low temperature, such as 750 degrees Celsius or a more intense blue and even turquoise blue with a high temperature, such as 1300 degrees Celsius. A variety of doping schemes provide a transparent ceramic material suitable for display protection and touch inputs. For example, certain ceramic materials combine when produced in the form of polycrystalline bulk parts a relatively high transmission or electromagnetic radiation, such as transparencies of greater than 70%. Some examples of transparent ceramics include $MgAl_2O_4$, AlON, PLZT, PZ (Fe, Nb, Ti, Nd) $O_3$, Yag, c-$ZRO_2$, and $Ca_{10}(PO_4)_6(OH)_2$. In various embodiments of chassis assembled from ceramic chassis elements as set forth herein, such as oxide and nitride ceramics, portions of an assembled chassis will have varying transparency, coloration and ductility by applying variations in manufacture techniques for each chassis element to meet the structural, electromagnetic and aesthetic goals of an information handling system.

Figure 10:
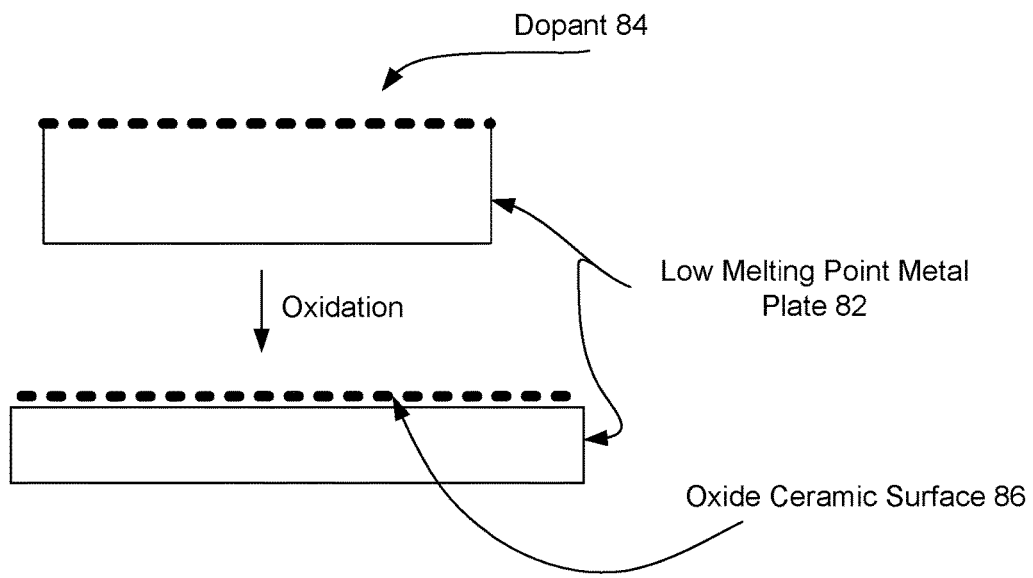
FIG. 10 depicts a functional block diagram of a process for coating a base metal with a dopant to form an oxide surface coating.

Referring now to FIG. 10, a functional block diagram depicts a process for forming a ceramic over a metal using a dopant to compensate for different coefficients of thermal expansion (CTE). When dissimilar metals having large differences in CTE values are welded adjacent each other, cooling after the welding process induces tensile stress in one metal and compressive stress in the other. Tensile stress can cause hot cracking during welding or cold cracking in service unless the stresses are relieved thermally or mechanically. The risk of metal failure under tensile stress is enhanced at joints that operate at elevated temperatures in a cyclic temperature mode. In order to reduce stress between metals having different CTE values, a glass seal is bonded or inductively welded at the joint. In the example embodiment depicted by FIG. 10, differences in CTE values for an oxide bonded over a base metal sheet are managed by doping the base metal sheet with at least one dopant that is oxidized with the surface of the base metal sheet.

In the example embodiment depicted by FIG. 10, a low melting point metal, such as a metal having a melting point of less than 2000 degrees Celsius, is formed to a chassis element shape 82 and has its surface coated with a dopant 84. One example of a low melting point metal is aluminum, which may be doped by a coating of one or more of zinc, indium, tin, manganese and silicon. In alternative embodiments, alternative metals of varying melting points and alternative dopants may be used, such as:

| Metallic material | Metal surface alloy/coating | dOxide/dmetal |
|---|---|---|
| Al | Zn, In, Sn, Mn, Si | 1.38 +− 20% |
| Tl | V, Nb, Gd, Al, Ni, Al, B | |
| Ni—Cu | Ti, Li, Al | 1.6 +− 20% |
| Cast Iron-Grphatized | Se, Ni | |
| Hi Stregth low alloy steel | Se, Ni, Cr | |
| Zn | All, In, Sn, Ga, Ti | 1.44 +− 20% |

Dopants for an underlying metal are selected so that density of the oxide formed over the base metal (dOxide) is higher than the density of the base metal (dMetal). Once the surface of chassis element 82 is coated with the desired dopant metal or metals 84, chassis element is annealed at a temperature substantially near 80% of the melting point of the base metal. Annealing is performed in an inert environment to obtain bonding between the underlying metal and dopant with the dopant having a thickness of between 5 and 10% of the thickness of the underlying metal. After annealing, oxidation is performed as described above to have the oxide coating 86 over the metal surface with a greater density than the underlying metal.

Figure 11:
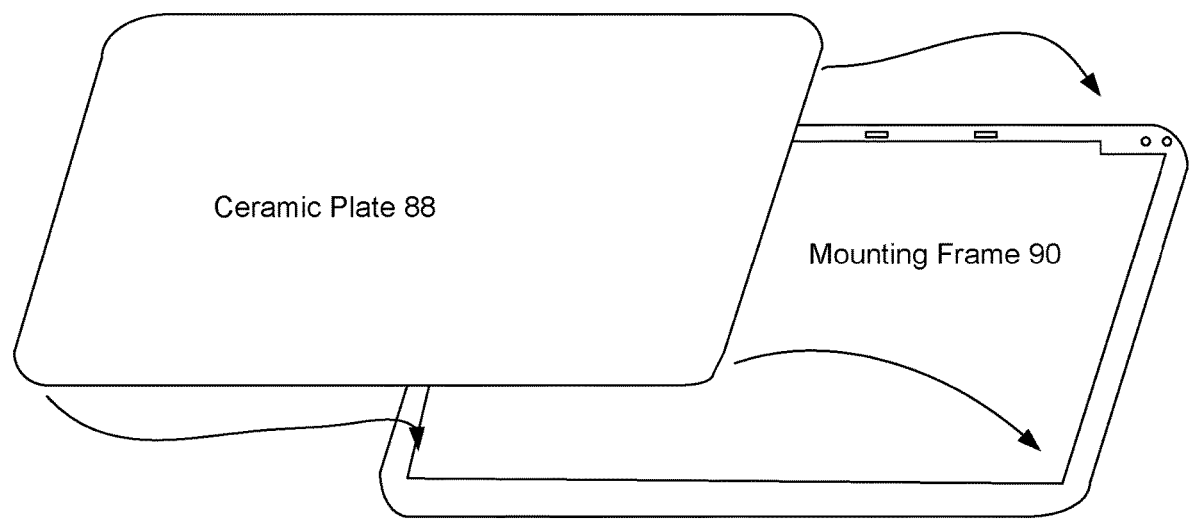
FIG. 11 depicts a ceramic plate for assembly into a mounting frame to make an information handling system chassis.

Referring now to FIG. 11, an example is depicted of a polymer frame 90 adapted to mount a ceramic plate for use in an information handling system. For example, ceramic plate is a top lid of a laptop information handling system or the bottom surface of a tablet information handling system. In one example embodiment, mounting frame 90 is a polymer that is bonded to ceramic plate. Although a variety of bonding techniques may be used, one technique for integration of ceramic plate 88 with mounting frame 90 is melting the separate pieces together to establish a bond. Mounting frame 90 is a polymer composite having a material compatible with ceramic plate 88. For instance, mounting frame 90 has alumina (Al2O3) or titania (TiO2) in polystyrene (PS) and poly methyl methacrylate (PMMA) matrixes. Greater than 50% loading of ceramic flakes, powder or fibers can increase the strength of polymer frame. Similar high strength commercial polymer like Lexan can also be used at various transparency levels. While one component oxide is preferred, note that similar density oxide can be loaded. Ceramic plate 88 is placed into position of mount frame 90 and then heated to melt the separate pieces into a contiguous piece for use as an information handling system chassis. Ceramic plate 88 may be formed completely as a ceramic piece, such as with injection molding and sintering, or as a base metal having a ceramic coating.

Although the present invention has been described in detail, it should be understood that various changes, substitutions and alterations can be made hereto without departing from the spirit and scope of the invention as defined by the appended claims.

What is claimed is:

1. An information handling system comprising:
   a processor operable to process information;
   memory interfaced with the processor and operable to store the information;
   a chassis, the processor and memory contained in the chassis, the chassis having at least one ceramic chassis element comprising a sheet of a first metal having an oxidized outer surface and a ceramic oxide of the first metal disposed over the oxidized outer surface; and
   copper disposed over the ceramic chassis element, the copper treated with microarc oxidation of sodium aluminum oxide.

2. The information handling system of claim 1 wherein the ceramic chassis element is rotated during the microarc oxidation of sodium oxide to provide a rotational pattern.

3. The information handling system of claim 1 wherein the copper thickness comprises less than 5 per cent of the ceramic chassis element weight.

\* \* \* \* \*